(12) United States Patent
Nagarajan et al.

(10) Patent No.: US 7,898,446 B2
(45) Date of Patent: Mar. 1, 2011

(54) CORRECTION OF SAMPLING MISMATCH IN TIME-INTERLEAVED ANALOG-TO-DIGITAL CONVERTERS

(75) Inventors: Viswanathan Nagarajan, Bangalore (IN); Visvesvaraya A. Pentakota, Bangalore (IN); Jagannathan Venkataraman, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 36 days.

(21) Appl. No.: 12/502,569

(22) Filed: Jul. 14, 2009

(65) Prior Publication Data

US 2010/0309033 A1 Dec. 9, 2010

(51) Int. Cl.
*H03M 1/06* (2006.01)
(52) U.S. Cl. ......................... 341/118; 341/120; 341/155
(58) Field of Classification Search .................. 341/118, 341/155
See application file for complete search history.

(56) References Cited

U.S. PATENT DOCUMENTS

| | | | |
|---|---|---|---|
| 6,452,518 B1 * | 9/2002 | Kawabata | 341/118 |
| 7,053,804 B1 * | 5/2006 | Nairn | 341/118 |
| 7,068,195 B1 | 6/2006 | Menkus | |
| 7,075,471 B1 | 7/2006 | Gupta | |
| 7,233,270 B2 | 6/2007 | Lin | |
| 7,253,762 B2 | 8/2007 | Huang et al. | |
| 7,283,074 B2 * | 10/2007 | Sheng et al. | 341/120 |
| 7,312,734 B2 * | 12/2007 | McNeill et al. | 341/120 |
| 7,372,386 B1 | 5/2008 | Maloberti et al. | |
| 7,701,376 B2 * | 4/2010 | Oshima et al. | 341/159 |
| 7,808,408 B2 * | 10/2010 | Madisetti et al. | 341/118 |
| 2006/0170581 A1 | 8/2006 | Lin | |
| 2006/0232460 A1 | 10/2006 | Huang et al. | |

(Continued)

FOREIGN PATENT DOCUMENTS

WO WO2006034415 3/2006

(Continued)

OTHER PUBLICATIONS

"Time-Interleaved Analog-to-Digital Converters: Status and Future Directions,"IEEE 2006, pp. 3386-3389 (Christian Vogel and Hakan Johansson).

(Continued)

*Primary Examiner*—Khai M Nguyen
(74) *Attorney, Agent, or Firm*—John J. Patti; Wade J. Brady, III; Frederick J. Telecky, Jr.

(57) ABSTRACT

A time-interleaved analog-to-digital converter (ADC) is provided. The ADC generally comprises a first ADC, a second ADC, correction circuit, a divider, and a clocking circuit. The first ADC receives an analog input signal and generates a first output and a differentiated output. The second ADC receives the analog input signal and generates a second output. The correction circuit receives the first output, the second output, and the differentiated output and generates a first error signal and a second error signal. The divider receives the first error signal and the second error signal and generates a timing error by dividing the second error signal by the first error signal, and the clocking circuit receives a clock signal and the timing error and generates a plurality of corrected clocking signals, where each of the first and second ADCs receives at least one of the clocking signals.

16 Claims, 1 Drawing Sheet

U.S. PATENT DOCUMENTS

2008/0024347 A1    1/2008    Choe

FOREIGN PATENT DOCUMENTS

| WO | WO2006083199 | 8/2006 |
|---|---|---|
| WO | WO2008149255 | 12/2008 |
| WO | WO2008156401 | 12/2008 |

OTHER PUBLICATIONS

"Adaptive Blind Compensation of Gain and Timing Mismatches in M-Channel Time-Interleaved ADCs," IEEE 2008, pp. 49-52 (Christian Vogel, Shahzad Saleem and Stefan Mendel).

* cited by examiner

CORRECTION OF SAMPLING MISMATCH IN TIME-INTERLEAVED ANALOG-TO-DIGITAL CONVERTERS

CROSS-REFERENCE TO RELATED APPLICATIONS

This application claims priority to Indian Application No. 1258/CHE/2009, filed Jun. 3, 2009, the entirety of which is incorporated herein by reference.

TECHNICAL FIELD

The invention relates generally to analog-to-digital converters (ADCs) and, more particularly, to time-interleaved ADCs.

BACKGROUND

Generally, time-interleaving of two ADCs can effectively double the speed of a signal ADC. However, for the two time-interleaved ADCs to operate as desired, the sampling instants should be separated by one-half of the period of the sample-and-hold clock (180° out of phase) and should be matched. Variation from the matching or difference in sampling instants can result in performance degradation. Temperature, as well as other factors, can also adversely affect the difference in the sampling instant. Traditional approaches, though, have been largely ineffective, so there is a desire for a more reliable solution.

Some examples of conventional circuit are: U.S. Pat. No. 7,068,195; U.S. Pat. No. 7,075,471; U.S. Pat. No. 7,233,270; U.S. Pat. No. 7,253,762; U.S. Pat. No. 7,372,386; U.S. Patent Pre-Grant Publ. No. 2006/0170581; U.S. Patent Pre-Grant Publ. No. 2006/0232460; U.S. Patent Pre-Grant Publ. No. 2008/0024347; PCT Publ. No. WO2006034415; PCT Publ. No. WO2006083199; PCT Publ. No. WO2008149255; PCT Publ. No. WO2008156401A1; Vogel et al., "Adaptive Blind Compensation of Gain and Timing Mismatches in M-Channel Time-Interleaved ADCs," *Electronics, Circuits and Systems, 2008. ICECS 2008. 15th IEEE International Conference*, pp. 49-52, Aug. 31, 2008-Sep. 3, 2008; and Vogel et al., "Time-Interleaved Analog-To-Digital Converters: Status and Future Directions," *Circuits and Systems, 2006. ISCAS 2006. Proceedings. 2006 IEEE International Symposium*, pp. 3386-3389, 2006

SUMMARY

A preferred embodiment of the present invention, accordingly, provides an apparatus. The apparatus comprises a first ADC that receives an analog input signal and that generates a first output and a differentiated output; a second ADC that receives the analog input signal and that generates a second output; a correction circuit that receives the first output, the second output, and the differentiated output and that generates a first error signal and a second error signal; a divider that receives the first error signal and the second error signal and that generates a timing error by dividing the second error signal by the first error signal; and a clocking circuit that receives a clock signal and the timing error and that generates a plurality of corrected clocking signals, wherein each of the first and second ADCs receives at least one of the clocking signals.

In accordance with a preferred embodiment of the present invention, the apparatus further comprises a multiplexer that receives each of the first and second outputs.

In accordance with a preferred embodiment of the present invention, the first and second ADCs further comprise a first ADC pipeline and a second ADC pipeline, respectively.

In accordance with a preferred embodiment of the present invention, the correction circuit further comprises: a plurality of delay circuits, wherein each delay circuit receives at least one of the first output, the differentiated output, and the second output; a plurality of multipliers, wherein each multiplier receives an output from at least one of the delay circuit; a first subtract-and-integrate circuit that receives an output from at least two of the multipliers and that outputs the first error signal; and a second subtract-and-integrate circuit that receives an output from at least two of the multipliers and that outputs the second error signal.

In accordance with a preferred embodiment of the present invention, the plurality of delay circuits further comprises: a first delay circuit that receives the first output and that delays the first output by one-half of a cycle of the clock signal; a second delay circuit that receives the differentiated output and that delays the differentiated output by one-half of a cycle of the clock signal; and a third delay that receives the second output.

In accordance with a preferred embodiment of the present invention, the plurality of multipliers further comprises: a first multiplier that receives an output from the first delay circuit and an output from the third delay circuit; a second multiplier that receives the output from the first delay circuit and the second output; a third multiplier that receives an output from the second delay circuit and the second output; and a fourth multiplier that receives the output from the second delay circuit and the output from the third delay circuit.

In accordance with a preferred embodiment of the present invention, the clocking circuit further comprises: a scaler that receives the timing error; a divide-by-2 circuit that receives the clock signal; a plurality of delay controllers, wherein each delay controller receives an output from the scaler and an output from at least divide-by-2 circuit, and each delay controller generates at least one of the corrected clocking signals.

In accordance with a preferred embodiment of the present invention, an apparatus is provided. The apparatus comprises a plurality of ADCs, wherein at least one of the ADCs generates a first output and a differentiated output, and wherein at least one of the ADCs generates a second output; a plurality of delay circuits, wherein each delay circuit is coupled to at least one of the ADCs such that: at least one of the delay circuits receives the first output; at least one of the delay circuits receives the differentiated output; and at least one of delay circuits receives the second output; a plurality of multipliers, wherein each multiplier is coupled to at least one of the delay circuits; a first subtract-and-integrate circuit that is coupled to at least two of the multipliers; a second subtract-and-integrate circuit that is coupled to at least two of the multipliers; a divider that is coupled to the first and second subtract-and-integrate circuits, wherein divider generates a timing error by dividing an output of the second subtract-and-integrate circuit by an output of the first subtract-and-hold circuit; a clocking circuit is coupled to the divider and each of the ADCs.

In accordance with a preferred embodiment of the present invention, an apparatus is provided. The apparatus comprises a first ADC; a second ADC; a first delay circuit that is coupled to the first ADC, wherein the first delay circuit delays an output from the first ADC by one-half of a cycle of a clock signal; a second delay circuit that is coupled to the first ADC, wherein the second delay circuit delays a differentiated output from the first ADC by one-half of a cycle of the clock signal; a third delay circuit that is coupled to the second ADC; a first multiplier that is coupled to the first delay circuit and to the third delay circuit; a second multiplier that is coupled to the second delay circuit and to the second ADC; a third multiplier that is coupled to the second ADC and to the first delay circuit; a fourth multiplier that is coupled to the third delay circuit and to the second delay circuit; a first subtract-and-integrate circuit that is coupled to the first and third multipliers; a second subtract-and-integrate circuit that is coupled to the second and fourth multipliers; a divider that is coupled to the first and second subtract-and-integrate circuit; a scaler that is coupled to the divider; a divide-by-2 circuit that receives the clock signal; a first delay controller that is coupled to the divide-by-2 circuit, the scaler, and the first ADC; and a second delay controller that is coupled to the divide-by-2 circuit, the scaler, and the second ADC.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
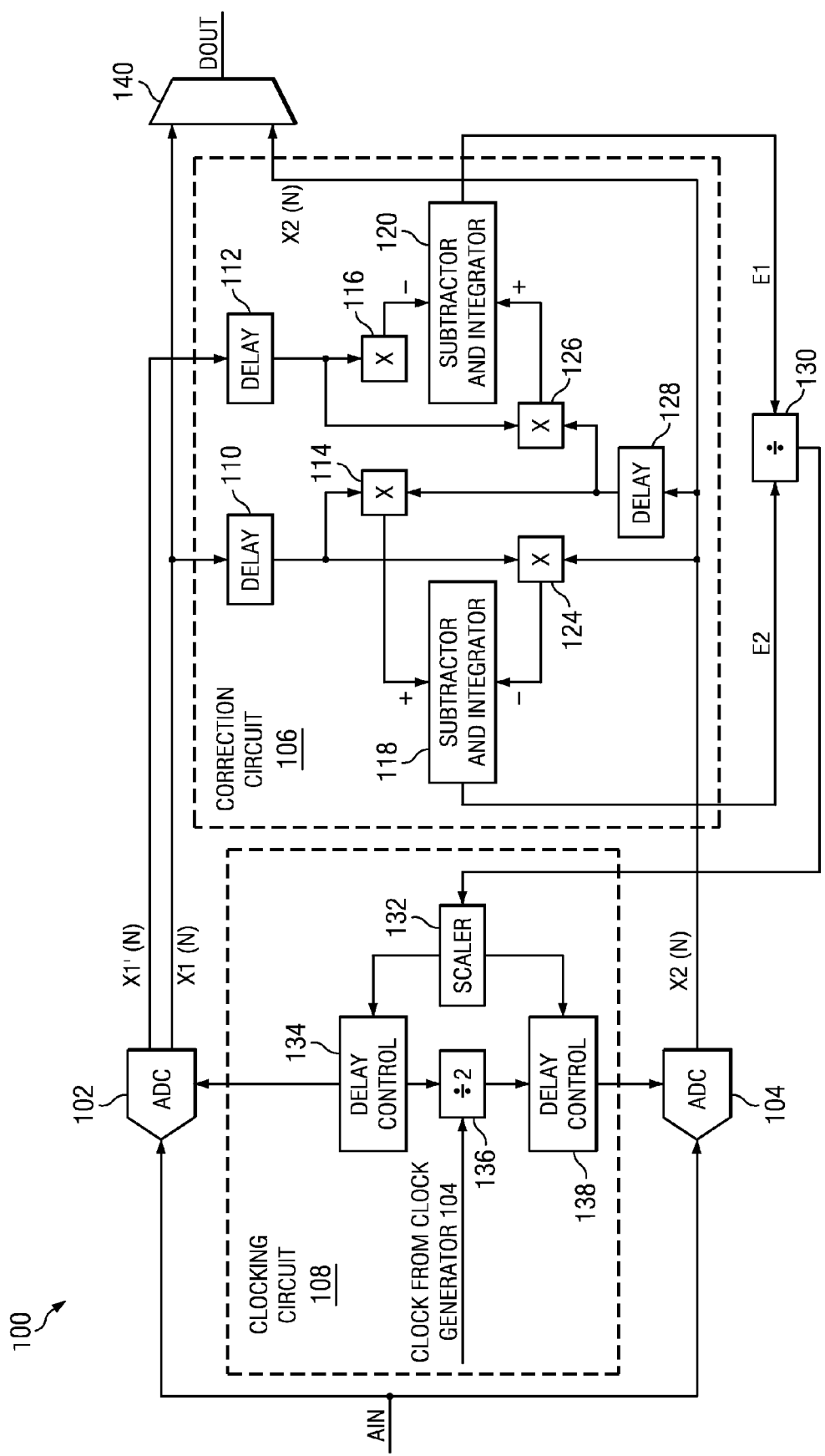
FIG. 1 is a circuit diagram of an example of a time-interleaved ADC in accordance with a preferred embodiment of the present invention.

Refer now to the drawings wherein depicted elements are, for the sake of clarity, not necessarily shown to scale and wherein like or similar elements are designated by the same reference numeral through the several views.

Turning to FIG. 1, an example of the time-interleaved ADC 100 can be seen. The time-interleaved ADC 100 generally comprises ADCs 102 and 104 (which can each also include one or more ADC pipelines), a correction circuit 106, a divider 130, and a clocking circuit 108. The correction circuit 106 generally comprises delay circuits 110, 112, and 128, multipliers 114, 116, 126, and 124, and subtract-and-integrate circuits 118 and 120. The clocking circuit 108 generally comprises a scaler 132, divide-by-2 circuit 136, and delay controllers 134 and 138.

In operation, each of ADCs 102 and 104 receives an analog signal AIN and outputs digital signals. Preferably, ADC 102 generates a digital output $x_1$ and a differentiated digital output $x_1'$, and ADC 104 generates a digital output $x_2$. Each of outputs $x_1$ and $x_2$ are also multiplexed together by multiplexer 140 and output as the digital output signal DOUT. Generally, each of $x_i$, $x_1'$, and $x_2$ are time dependent and can be represented as follows (where T is the sampling period or period of clock signal CLK, $\omega$ is frequency of the analog signal AIN, and $\Delta T$ is the timing error between ADCs 102 and 104):

$$x_1(n) = A\cos(n\omega T) \quad (1)$$

$$x_1'(n) = \frac{dx_1(n)}{d(nT)} = -A\omega \sin(n\omega T) \quad (2)$$

$$x_2(n) = A\cos(n\omega T + \omega \Delta T) \quad (3)$$

To provide the proper alignment between the ADCs 102 and 104, the correction circuit 106, divider 130 and clocking circuitry 108 operate cooperatively to provide corrected clocking signals to ADCs 102 and 104. ADC 102 is coupled to delay circuits 110 and 112, which delay the digital output $x_1$ and the differentiated differential output $x_1'$, respectively, by one-half of a cycle of the clock signal CLK. ADC 104 is coupled to delay circuit 128, which delays the digital output $x_2$ by one cycle of the clock signal CLK. The delays 110, 112, and 128 are coupled to the multipliers 114, 116, 124, and 126, which, in turn, are coupled to subtract-and-integrate circuits 118 and 120. By employing these circuit elements, the outputs can be combined to generate two error signals E1 and E2. Error signals E1 and E2 are as follows:

$$E1 = \sum_n x_2(n+1)x_1'(n) - x_2(n-1)x_1'(n) \quad (4)$$

$$E2 = \sum_n x_2(n+1)x_1(n) - x_2(n-1)x_1(n) \quad (5)$$

Now, by substituting Equations (1) through (3), as appropriate, into Equations (4) and (5), Equations (4) and (5) respectively become:

$$E1 = A^2\omega \sum_n \begin{pmatrix} -\cos(\omega T(n+1) + \omega \Delta T)\sin(\omega nT) + \\ \cos(\omega T(n-1) + \omega \Delta T)\sin(\omega nT) \end{pmatrix} \quad (6)$$

$$E2 = A^2 \sum_n \begin{pmatrix} \cos(\omega T(n+1) + \omega \Delta T)\cos(\omega nT) - \\ \cos(\omega T(n-1) + \omega \Delta T)\cos(\omega nT) \end{pmatrix} \quad (7)$$

Equation (6) can then be reduced as follows:

$$E1 = A^2\omega \sum_n \frac{1}{2} \begin{pmatrix} \sin(\omega T + \omega \Delta T) - \\ \sin(2n\omega T + \omega T + \omega \Delta T) + \\ \sin(2n\omega T - \omega T + \omega \Delta T) - \\ \sin(\omega \Delta T - \omega T) \end{pmatrix} \quad (8)$$

$$= A^2\omega \sum_n (\sin(2n\omega T + \omega \Delta T)\cos(\omega T) + \cos(\omega \Delta T)\sin(\omega T))$$

Additionally, Equation (7) can be reduced as follows:

$$E2 = A^2 \sum_n \frac{1}{2} \begin{pmatrix} \cos(2n\omega T + \omega T + \omega \Delta T) + \\ \cos(\omega T + \omega \Delta T) - \\ \cos(2n\omega T - \omega T + \omega \Delta T) - \\ \cos(\omega \Delta T - \omega T) \end{pmatrix} \quad (9)$$

$$= A^2 \sum_n (-\sin(2n\omega T + \omega\Delta T)\sin(\omega T) - \sin(\omega T)\sin(\omega\Delta T))$$

Each of Equations (8) and (9) can then be approximated as follows:

$$E1 \approx A^2\omega \cos(\omega\Delta T)\sin(\omega T) \quad (10)$$

$$E2 \approx -A^2 \sin(\omega\Delta T)\sin(\omega T) \quad (11)$$

Also, for $\omega\Delta T \ll 1$, Equations (10) and (11) can further be approximated to:

$$E1 \approx A^2\omega \sin(\omega T) \quad (10)$$

$$E2 \approx -A^2\omega\Delta T \sin(\omega T) \quad (11)$$

As can be seen from these error signals E1 and E2, the timing error ΔT can be determined. Thus, once the correction circuit 106 has determined the error signals E1 and E2, each of error signals E1 and E2 are supplied to the divider 130, which divides error signal E2 by error signal E1 to determine timing error ΔT. The divider 130 can then output the timing error ΔT to the clocking circuit 108.

The scaler 132 of the clocking circuit 108 receives the timing error ΔT from the divider 130 and supplies control signals to the delay controllers 134 and 138. Additionally, the divide-by-2 circuit 136 receives the clock signal CLK from the clock generator 104 and provides a clocking signal (with half of the frequency of the clock signal CLK) to each of the delay controllers 138 and 134. With the control signals from the scaler 132 and the clock signal from the divide-by-2 circuit, each of delay controllers 134 and 138 can provide clocking signals to its respective ADC 102 and 104 to generally stabilize the timing error ΔT so that the sampling instant of each of the ADCs 102 and 104 are separated by an interval of about T/2, where T is the sampling period or period of clock signal CLK.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    a first analog-to-digital converter (ADC) that receives an analog input signal and that generates a first output and a differentiated output;
    a second ADC that receives the analog input signal and that generates a second output;
    a correction circuit that receives the first output, the second output, and the differentiated output and that generates a first error signal and a second error signal;
    a divider that receives the first error signal and the second error signal and that generates a timing error by dividing the second error signal by the first error signal; and
    a clocking circuit that receives a clock signal and the timing error and that generates a plurality of corrected clocking signals, wherein each of the first and second ADCs receives at least one of the clocking signals.

2. The apparatus of claim 1, wherein the apparatus further comprises a multiplexer that receives each of the first and second outputs.

3. The apparatus of claim 1, wherein the first and second ADCs further comprise a first ADC pipeline and a second ADC pipeline, respectively.

4. The apparatus of claim 1, wherein the correction circuit further comprises:
    a plurality of delay circuits, wherein each delay circuit receives at least one of the first output, the differentiated output, and the second output;
    a plurality of multipliers, wherein each multiplier receives an output from at least one of the delay circuit;
    a first subtract-and-integrate circuit that receives an output from at least two of the multipliers and that outputs the first error signal; and
    a second subtract-and-integrate circuit that receives an output from at least two of the multipliers and that outputs the second error signal.

5. The apparatus of claim 4, wherein the plurality of delay circuits further comprises:
    a first delay circuit that receives the first output and that delays the first output by one-half of a cycle of the clock signal;
    a second delay circuit that receives the differentiated output and that delays the differentiated output by one-half of a cycle of the clock signal; and
    a third delay that receives the second output.

6. The apparatus of claim 5, wherein the plurality of multipliers further comprises:
    a first multiplier that receives an output from the first delay circuit and an output from the third delay circuit;
    a second multiplier that receives the output from the first delay circuit and the second output;
    a third multiplier that receives an output from the second delay circuit and the second output; and
    a fourth multiplier that receives the output from the second delay circuit and the output from the third delay circuit.

7. The apparatus of claim 1, wherein the clocking circuit further comprises:
    a scaler that receives the timing error;
    a divide-by-2 circuit that receives the clock signal;
    a plurality of delay controllers, wherein each delay controller receives an output from the scaler and an output from at least divide-by-2 circuit, and each delay controller generates at least one of the corrected clocking signals.

8. An apparatus comprising:
    a plurality of ADCs, wherein at least one of the ADCs generates a first output and a differentiated output, and wherein at least one of the ADCs generates a second output;
    a plurality of delay circuits, wherein each delay circuit is coupled to at least one of the ADCs such that:
        at least one of the delay circuits receives the first output;
        at least one of the delay circuits receives the differentiated output; and
        at least one of delay circuits receives the second output;
    a plurality of multipliers, wherein each multiplier is coupled to at least one of the delay circuits;
    a first subtract-and-integrate circuit that is coupled to at least two of the multipliers;
    a second subtract-and-integrate circuit that is coupled to at least two of the multipliers;
    a divider that is coupled to the first and second subtract-and-integrate circuits, wherein divider generates a timing error by dividing an output of the second subtract-and-integrate circuit by an output of the first subtract-and-integrate circuit;

a clocking circuit is coupled to the divider and each of the ADCs.

9. The apparatus of claim 8, wherein the apparatus further comprises a multiplexer that is coupled to each of the ADCs.

10. The apparatus of claim 8, wherein the ADCs further comprise a plurality of ADC pipelines.

11. The apparatus of claim 8, wherein the plurality of delay circuits further comprises:

a first delay circuit that receives the first output and that delays the first output by one-half of a cycle of the clock signal;

a second delay circuit that receives the differentiated output and that delays the differentiated output by one-half of a cycle of the clock signal; and a third delay that receives the second output.

12. The apparatus of claim 8, wherein the plurality of multipliers further comprises:

a first multiplier that receives an output from the first delay circuit and an output from the third delay circuit;

a second multiplier that receives the output from the first delay circuit and the second output;

a third multiplier that receives an output from the second delay circuit and the second output; and a fourth multiplier that receives the output from the second delay circuit and the output from the third delay circuit.

13. The apparatus of claim 8, wherein the clocking circuit further comprises:

a scaler is coupled to the divider;

a divide-by-2 circuit that receives the clock signal;

a plurality of delay controllers, wherein each delay controller is coupled to the scaler and to the divide-by-2 circuit, and wherein each delay controller is coupled to at least one of the ADCs.

14. An apparatus comprising:

a first ADC;

a second ADC;

a first delay circuit that is coupled to the first ADC, wherein the first delay circuit delays an output from the first ADC by one-half of a cycle of a clock signal;

a second delay circuit that is coupled to the first ADC, wherein the second delay circuit delays a differentiated output from the first ADC by one-half of a cycle of the clock signal;

a third delay circuit that is coupled to the second ADC;

a first multiplier that is coupled to the first delay circuit and to the third delay circuit;

a second multiplier that is coupled to the second delay circuit and to the second ADC;

a third multiplier that is coupled to the second ADC and to the first delay circuit;

a fourth multiplier that is coupled to the third delay circuit and to the second delay circuit;

a first subtract-and-integrate circuit that is coupled to the first and third multipliers;

a second subtract-and-integrate circuit that is coupled to the second and fourth multipliers;

a divider that is coupled to the first and second subtract-and-integrate circuits;

a scaler that is coupled to the divider;

a divide-by-2 circuit that receives the clock signal;

a first delay controller that is coupled to the divide-by-2 circuit, the scaler, and the first ADC; and a second delay controller that is coupled to the divide-by-2 circuit, the scaler, and the second ADC.

15. The apparatus of claim 14, wherein the apparatus further comprises a multiplexer that is coupled to each of the ADCs.

16. The apparatus of claim 14, wherein the ADCs further comprise a plurality of ADC pipelines.

* * * * *